(12) United States Patent
Zhou

(10) Patent No.: US 7,058,874 B2
(45) Date of Patent: Jun. 6, 2006

(54) INTERLEAVER ADDRESS GENERATOR AND METHOD OF GENERATING AN INTERLEAVER ADDRESS

(75) Inventor: Gongyu Grace Zhou, North Epping (AU)

(73) Assignee: Lucent Technologies Inc., Murray Hill, NJ (US)

( * ) Notice: Subject to any disclaimer, the term of this patent is extended or adjusted under 35 U.S.C. 154(b) by 630 days.

(21) Appl. No.: 10/153,824

(22) Filed: May 24, 2002

(65) Prior Publication Data

US 2003/0221084 A1    Nov. 27, 2003

(51) Int. Cl.
*H03M 13/00* (2006.01)

(52) U.S. Cl. ..................... 714/756; 711/218
(58) Field of Classification Search ........... 714/752, 714/755, 759, 762, 702, 701, 756; 711/218
See application file for complete search history.

(56) References Cited

U.S. PATENT DOCUMENTS 6,631,491 B1 * 10/2003 Shibutani et al. ........... 714/762

FOREIGN PATENT DOCUMENTS

EP    1 1871339 A1 *    3/2002

* cited by examiner

*Primary Examiner*—Phung My Chung (57) ABSTRACT

An interleaver circuit architectures, which utilizes the relationship between intra-row elements in a matrix, in order to simplify the MOD computations necessary in an interleaver. The interleaver calculates a subset of results, stores those results, performs operations on the stored results in order to obtain new results, then updates at least some of the old results with the new results for the next column operation. The interleaver address is then calculated row by row. By storing only a subset of the results and replacing old results with new results, the interleaver can calculate the interleaver address "on the fly" in one clock cycle with very little delay. The interleaver may also require less power and smaller substrate surface area.

30 Claims, 4 Drawing Sheets

INTERLEAVER ADDRESS GENERATOR AND METHOD OF GENERATING AN INTERLEAVER ADDRESS

FIELD OF THE INVENTION

The field of the invention relates to a communication system, and more particularly, to wireless communications systems.

DESCRIPTION OF THE RELATED ART

The transmission of digital data is inherently prone to interference, which may introduce errors into the transmitted data. Error detection techniques have been suggested to determine as reliably as possible whether errors have been introduced into the transmitted data. For example, it is common to transmit data in packets and add to each packet a cyclic redundancy check (CRC) field, for example of a length of sixteen bits, which carries a checksum of the data of the packet. When a receiver receives the data, the receiver calculates the same checksum on the received data and verifies whether the result of the calculation is identical to the checksum in the CRC field.

When the transmitted data is not used on-line, it is possible to request retransmission of erroneous data when errors are detected. However, when the transmission is performed on-line, such as, e.g., in telephone lines, cellular phones, remote video systems, etc., it is not possible to request retransmission.

Convolutional codes have been introduced to allow receivers of digital data to correctly determine the transmitted data even when errors may have occurred during transmission. The convolutional codes introduce redundancy into the transmitted data and pack the transmitted data into packets in which the value of each bit is dependent on earlier bits in the sequence. Thus, when errors occur, the receiver can still deduce the original data by tracing back possible sequences in the received data.

To further improve the performance of a transmission channel, some coding schemes include interleavers, which mix up the order of the bits in the packet during coding. Thus, when interference destroys some adjacent bits during transmission, the effect of the interference is spread out over the entire original packet and can more readily be overcome by the decoding process. Other improvements may include multiple-component codes that encode the packet more than once, in parallel or in series. For example, it is known in the art to employ an error correction method that uses at least two convolutional coders in parallel. Such parallel encoding is commonly referred to as turbo coding.

For multiple-component codes, optimal decoding is often a very complex task, and may require large periods of time not usually available for on-line decoding. Iterative decoding techniques have been developed to overcome this problem. Rather than determining immediately whether received bits are zero or one, the receiver assigns each bit a value on a multilevel scale representative of the probability that the bit is one. A common scale, referred to as log-likelihood ratio (LLR) probabilities, represents each bit by an integer in some range, e.g., $\{-32, 31\}$. A value of 31 signifies that the transmitted bit was a zero with very high probability, and a value of $-32$ signifies that the transmitted bit was a one, with very high probability. A value of zero indicates that the logical bit value is indeterminate.

Data represented on the multilevel scale is referred to as "soft data," and iterative decoding is usually soft-in/soft-out, i.e., the decoding process receives a sequence of inputs corresponding to probabilities for the bit values and provides as output corrected probabilities, taking into account constraints of the code. Generally, a decoder that performs iterative decoding uses soft data from former iterations to decode the soft data read by the receiver. During iterative decoding of multiple—component codes, the decoder uses results from decoding of one code to improve the decoding of the second code. When parallel encoders are used, as in turbo coding, two corresponding decoders may conveniently be used in parallel for this purpose. Such iterative decoding is carried out for a plurality of iterations until it is believed that the soft data closely represents the transmitted data. Those bits that have a probability indicating that they are closer to one (for example, between 0 and 31 on the scale described above) are assigned binary zero, and the remaining bits are assigned binary one.

"Turbo coding" represents an important advancement in the area of forward error correction (FEC). There are many variants of turbo coding, but most types of turbo coding use multiple encoding steps separated by interleaving steps combined with the use of iterative decoding. This combination provides previously unavailable performance with respect to noise tolerance in a communications system. Namely, turbo coding allows communications at levels of energy-per-bit per noise power spectral density ($E_b/N_o$) that were previously unacceptable using the existing forward error correction techniques.

Many communications systems use forward error correction techniques and therefore would benefit from the use of turbo coding. For example, turbo codes could improve the performance of wireless satellite links, in which the limited downlink transmit power of the satellite necessitates receiver systems that can operate at low $E_b/N_o$ levels. Digital wireless telecommunication systems, for example, digital cellular and PCS telephone systems, also use forward error correction. For example, the Third Generation Partnership Project (3GPP) has promulgated the Group Radio Access Network Standard TS 25.212 V4.0.0, which defines a digital wireless communication system that uses multiplexing and channel coding.

As described above, an interleaver is an important part of turbo coding and decoding. Various known references describe turbo interleaver implementations. In most contemporary solutions, the turbo interleaver is implemented using a digital signal processor (DSP) and memory lookup table to calculate and determine the proper interleaving address.

In one reference, a VLSI implementation is illustrated for a turbo decoder, where the turbo interleaver is implemented as a SRAM and an EPROM containing the scrambling addresses, which must be pre-programmed by a DSP. Another reference illustrates a VLSI implementation of a turbo decoder, where the interleaver is implemented as a RAM and a ROM containing the scrambling addresses, which must be hard-coded and is very large. As described above, the traditional and popular solution for the interleaver address generation is based on a ROM or a RAM. The interleaver addresses are stored in the ROM/RAM, then read out one by one.

One of the most common computations performed by a turbo interleaver is a "MOD" computation, common in residue number theory. Simple examples include 12 MOD 4=0, 12 MOD 5=2, 135 MOD 6=3, etc. Conventionally, the MOD computation is performed via division or several steps of addition, comparison, and subtraction which require more than one clock cycle to achieve, especially for large number MOD computations.

MOD computations also require a large amount of computing/processing power and circuit area in order to compute the MOD value quickly. The computing/processing power required is often several cycles, which introduces an undesirable delay. In conventional implementations, which compute numbers up to MOD 33, 20.6 mm² of silicon area is required.

In summary, conventional implementations of turbo interleavers require too much processing time in the way of DSP clock cycles, too much memory, too much power and too much surface area on a silicon chip.

SUMMARY OF THE INVENTION

The present invention is directed to a turbo interleaver circuit architecture, which utilizes the relationship between intra-row elements in a matrix, in order to simplify the MOD computations necessary in an interleaver. In one exemplary embodiment of the present invention, the interleaver calculates a subset of results, stores those results, performs an add/compare/subtract operation between the stored results in order to obtain new results, then updates at least some of the old results with the new results for the next column operation. The interleaver address is then calculated row by row.

By storing only a subset of the results and replacing old results with new results, the interleaver in one exemplary embodiment calculates the interleaver address "on the fly" in one clock cycle with very little delay. The interleaver may also require less power and smaller substrate surface area. In an exemplary embodiment of the present invention, the interleaver performs the MOD computation utilizing only addition, comparison, and subtraction operations instead of division operations. In a more specific exemplary embodiment, the interleaver obtains a MOD computation result with only a single addition, comparison, and subtraction. As a result, the MOD calculation may be performed in one clock cycle; consequently, the interleaver address generation is produced more quickly than in conventional interleavers which implement division and/or multiplication and shift operations.

The interleaver in at least one exemplary embodiment of the present invention also reduces the traditional large address memory and DSP computation load to generate the interleaver address "on the fly".

In yet another exemplary embodiment, the interleaver of the present invention, performs interleaving based on inter-row and intra-row permutations among a rectangular matrix. The number of rows are selectable from fixed numbers set by a standard (for example 5, 10, and 20 as may be defined by a standards) and the number of columns of the rectangular matrix are decided (again as may be determined by a standard) by the nearest prime number. For example, if the block length of the input data K is 44, the number of rows is set at 5, and the number of columns is set at 10, then 5×10=50 interleaving addresses will be generated from the rectangular matrix (interleaving addresses 0–49 in random order). If the number of interleaving addresses generated 50 is greater than the block length of the input data, 44, all addresses greater than or equal to 44 are invalid, and therefore not useful addresses. In the above example, addresses 44–50 are said to be "pruned". If K=50, then no addresses are pruned.

In other exemplary embodiments, the interleaver of the present invention utilizes two addition/comparison/subtraction circuits to avoid losing a clock cycle when pruning an invalid address. In at least one exemplary embodiment, the interleaver produces two addresses in every clock cycle, but only one is selected. During pruning, if a first address is found to be invalid, namely the address is greater than the block length, then the other address can be used immediately without waiting for the next clock cycle to calculate it.

As a result, the interleaver of the exemplary embodiments of the present invention has an efficient structure and is applicable to mobile wireless communication systems, such as UMTS/DoCoMo data channel processing as specified in the standards documentation by 3GPP. The interleaver of the exemplary embodiments of the present invention is implemented with significantly reduced memory size and simplified construction for data interleaving address to be generated "on-the-fly".

BRIEF DESCRIPTION OF THE DRAWINGS

The present invention will be better understood from reading the following description of non-limiting embodiments, with reference to the attached drawings, wherein.

DETAILED DESCRIPTION

An algorithm for producing an interleaved address may include several steps. An exemplary algorithm includes the steps of formatting the input data bits into a rectangular matrix, performing intra-row and inter-row permutations on the rectangular matrix, and outputting the bits from the rectangular matrix with pruning.

The first step is to format the input bits into a rectangular matrix. If K is the number of input bits in the data block to encode, the number of rows R and columns C of the rectangular matrix may be determined as follows.

1. Determine the number of rows R of the rectangular matrix such that:

$$R = \begin{cases} 5, & \text{if } (40 \leq K \leq 159) \\ 10, & \text{if } ((160 \leq K \leq 200) \text{ or } (481 \leq K \leq 530)) \\ 20, & \text{if } (K = \text{any other value}) \end{cases}$$

The rows of rectangular matrix are numbered 0, 1, 2, . . . , R−1 from top to bottom.

2. Determine the prime number p and the number of columns C of the rectangular matrix such that:

if (481≦K≦530) then p=53 and C=p.

else find the minimum prime p such that (p+1)−K/R≧0, where p is the minimum prime number>=(K/R)−1.

C is determined by the value of p with respect to K/R as depicted above.

The columns of rectangular matrix are numbered 0, 1, 2, . . . , C−1 from left to right.

3. When R and C have been determined, the input bits can be written into a R×C matrix row by row.
4. Compute the intra-row and inter-row permutations within the R×C rectangular matrix.

The second step is to perform intra-row and inter-row permutations on the rectangular matrix. The following algorithm may be used to compute the intra-row and inter-row permutation.

(1) Select a primitive root ν (for example for Table 1, which is provided in the 3GPP Standard.)
(2) Construct a base sequence s(i) for intra-row permutation as:

$$s(i)=[\nu \times s(i-1)] \bmod p, \ i=1, 2, \ldots, (p-2)., \text{ and } s(0)=1$$

(3) Let $q_0=1$ be the first prime integer in $\{q_j\}$,
Select the consecutive minimum prime integers $\{q_j\}$ (j=1, 2, . . . , R−1) such that: $\gcd\{q_j, p-1\}=1$, $q_j>6$, and $q_j>q_{(j-1)}$, where g.c.d. is greatest common divisor.
(4) Permute sequence $\{q_j\}$ to get sequence $\{r_j\}$ such that $r_{T(j)}=q_j$, j=0, 1, . . . , R−1,
where T(j) (j=0, 1, 2, . . . , R−1) is the inter-row permutation pattern defined as the one of the following four patterns: $Pat_1$, $Pat_2$, $Pat_3$ and $Pat_4$ depending on the number of input bits K.

TABLE 1

Table of prime numbers p and associated primitive roots ν

| p | ν |
|---|---|
| 7 | 3 |
| 11 | 2 |
| 13 | 2 |
| 17 | 3 |
| 19 | 2 |
| 23 | 5 |
| 29 | 2 |
| 31 | 3 |
| 37 | 2 |
| 41 | 6 |
| 43 | 3 |
| 47 | 5 |
| 53 | 2 |
| 59 | 2 |
| 61 | 2 |
| 67 | 2 |
| 71 | 7 |
| 73 | 5 |
| 79 | 3 |
| 83 | 2 |
| 89 | 3 |
| 97 | 5 |
| 101 | 2 |
| 103 | 5 |
| 107 | 2 |
| 109 | 6 |
| 113 | 3 |
| 127 | 3 |
| 131 | 2 |
| 137 | 3 |
| 139 | 2 |
| 149 | 2 |

TABLE 1-continued

Table of prime numbers p and associated primitive roots ν

| p | ν |
|---|---|
| 151 | 6 |
| 157 | 5 |
| 163 | 2 |
| 167 | 5 |
| 173 | 2 |
| 179 | 2 |
| 181 | 2 |
| 191 | 19 |
| 193 | 5 |
| 197 | 2 |
| 199 | 3 |
| 211 | 2 |
| 223 | 3 |
| 227 | 2 |
| 229 | 6 |
| 233 | 3 |
| 239 | 7 |
| 241 | 7 |
| 251 | 6 |
| 257 | 3 |

$$\{T(0), T(1), T(2), \ldots, T(R-1)\} = \begin{cases} Pat_4 & \text{if } (40 \leq K \leq 159) \\ Pat_3 & \text{if } (160 \leq K \leq 200) \\ Pat_1 & \text{if } (201 \leq K \leq 480) \\ Pat_3 & \text{if } (481 \leq K \leq 530) \\ Pat_1 & \text{if } (531 \leq K \leq 2280) \\ Pat_2 & \text{if } (2281 \leq K \leq 2480) \\ Pat_1 & \text{if } (2481 \leq K \leq 3160) \\ Pat_2 & \text{if } (3161 \leq K \leq 3210) \\ Pat_1 & \text{if } (3211 \leq K \leq 5114), \end{cases}$$

where $Pat_1$, $Pat_2$, $Pat_3$ and $Pat_4$ have the following patterns respectively.

$Pat_1$: {19, 9, 14, 4, 0, 2, 5, 7, 12, 18, 10, 8, 13, 17, 3, 1, 16, 6, 15, 11}
$Pat_2$: {19, 9, 14, 4, 0, 2, 5, 7, 12, 18, 16, 13, 17, 15, 3, 1, 6, 11, 8, 10}
$Pat_3$: {9, 8, 7, 6, 5, 4, 3, 2, 1, 0}
$Pat_4$: {4, 3, 2, 1, 0}

(5) Perform the j-th (j=0, 1, 2, . . . , R−1) intra-row permutation as:
When C=p, $U_j(i)=s([i \times r_j] \bmod (p-1))$, i=0, 1, 2, . . . , (p−2)., and $U_j(p-1)=0$, C=p,
When C=p+1, $U_j(i)=s([i \times r_j] \bmod (p-1))$, i=0, 1, 2, . . . , (p−2)., $U_j(p-1)=0$, and $U_j(p)=p$, if (K=C×R) then exchange $U_{R-1}(p)$ with $U_{R-1}(0)$.
When C=p−1, $U_j(i)=s([i \times r_j] \bmod (p-1))-1$, i=0, 1, 2, . . . , (p−2),
The maximum-size of the permutation matrix is 20×256.
(6) Perform the inter-row permutation based on the pattern T(j) (j=0, 1, 2, . . . , R−1);

where T(j) is the original row position of the j-th permuted row.

Figure 1:
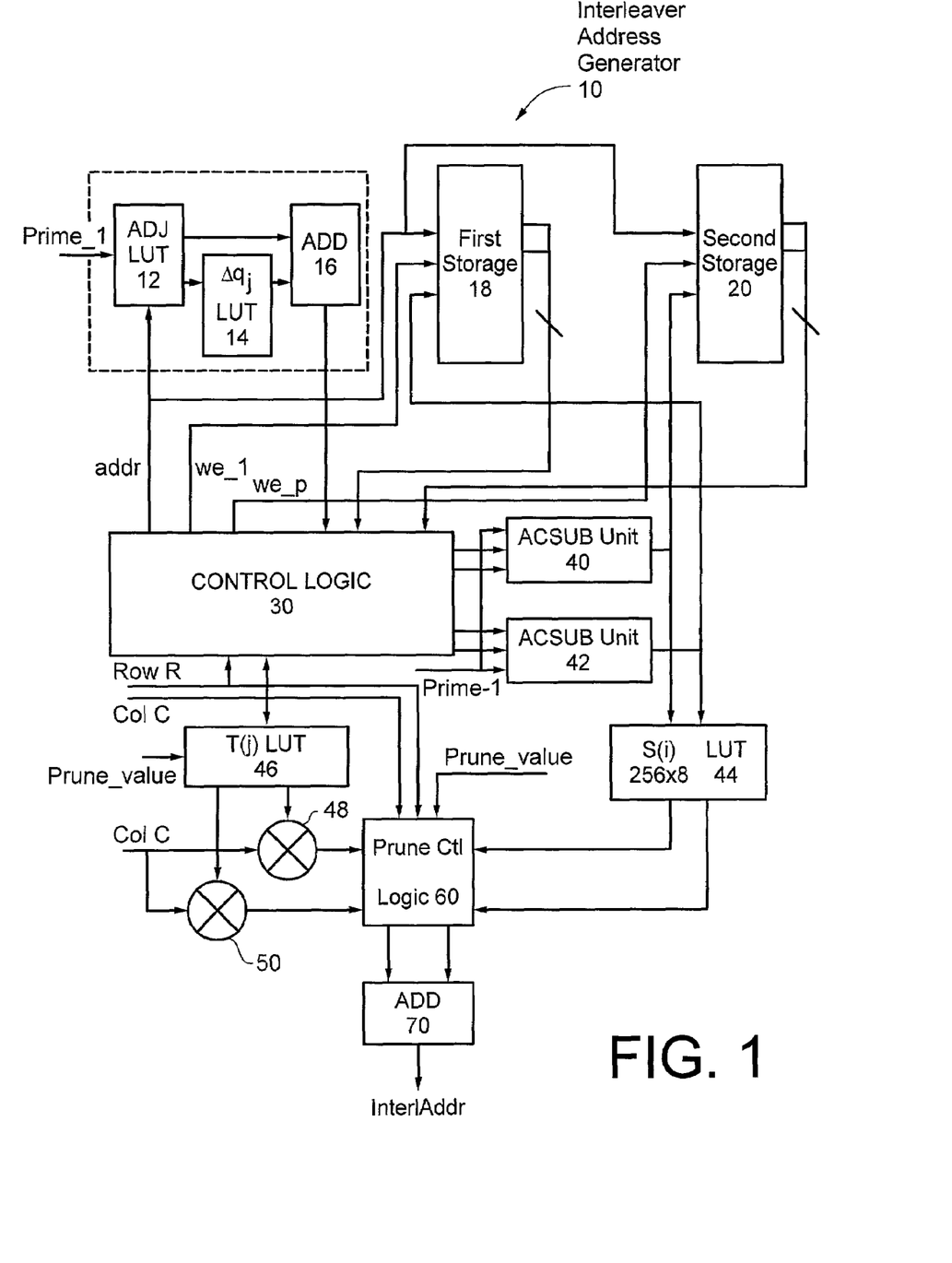
FIG. 1 illustrates a hardware diagram of an interleaver in accordance with an exemplary embodiment of the present invention.

The output of the Turbo code internal interleaver is the bit sequence read out column by column from the intra-row and inter-row permuted R×C matrix starting with row 0 of column 0 and ending with row R−1 of column C−1. The output may be pruned by deleting bits that were not present in the input bit sequence, i.e. the number of bits output from Turbo code internal interleaver is K and the total number of pruned bits is:

FIG. 1 illustrates exemplary hardware for implementing an exemplary algorithm for producing an interleaved address. The interleaver address generator 10 includes ADJLUT 12, LUT 14, and adder 16 as well as first storage 18 and second storage 20. The interleaver address generator 10 also includes control logic 30, add/compare/subtract (ACSUB) units 40 and 42, lookup tables 44 and 46, multipliers 48 and 50, prune control logic 60 and adder 70. In an exemplary embodiment, the first storage 18 and second storage 20 are each implemented as a bank of D-flip flops.

Exemplary calculations performed by the interleaver address generator 10 of the present invention are as follows. In a given row, if a first column MOD result is 1*r MOD p=a, and the jth column MOD result is j*r MOD p=b, then the succeeding column (j+1)th computation is (j+1)*r MOD p=(1*r MOD p+j*r MOD p) MOD p=(a+b) MOD p. Since both a and b are less than p, (a+b) MOD p may be computed with a single adder, comparator, and subtractor. As a result, the desired result may be obtained without a large amount of computation. In the above example, a and b are defined as old results, which are stored in the first storage 18 and the second storage 20, respectively. "a" will always be stored in the first storage 18 for all the new computations and "b" will be stored in the second storage 18 and updated whenever the succeeding new result has been calculated.

The results of the MOD computations above are then used as an index of the lookup table, S(i)LUT 44 and the true intra-row permutation order is supplied from Table 2, which can be provided by a DSP or stored in a ROM.

In some exemplary algorithms, the interleaving is based on inter-row and intra-row permutation among a rectangular matrix, and the numbers of row are only selectable from a fixed set (for example, 5, 10, 20, . . . ), the number of column is determined based on the nearest prime number. For example, if the block length K=44, the row assigned is 5, and column assigned is 10, then 5*10=50 interleaving address will be generated from the matrix (0,1, . . . , 49 in random order). All invalid addresses are pruned, namely those with values longer than K. In this example, only addresses 0–43 are useful addresses. If K=50, then there is no need to prune any addresses.

After the MOD calculation, pruning by the prune control circuit 60 may occur. For example, in the first clock cycle, the row 1, column 1 and row 2, column 1 addresses are generated, if both are valid, the (1,1) address is selected otherwise the (2,1) address is the substitute. Then in the next clock cycle the (2,1) address and the (3,1) address are calculated if no pruning was performed in last cycle or the (3,1) address and the (4,1) address are generated if pruning occurred in last cycle. In the no pruning case, the (2,1) address has already been calculated in the last clock cycle, in order to save power. The prune control circuit 60 stops the computation path for the (2,1) address in the repeated calculation period.

The operation of the interleaver address generator 10 is most easily described in conjunction with Table 2. For operation of the interleaver address generator 10, a prime integer p is selected according to the length of data input to the interleaver address generator 10. $\{q_j\}$ in Table 2 is defined as a sequence of minimum prime integers starting with 1 and having a maximum size (in an exemplary embodiment, the maximum size is 20 prime numbers, but the interleaving structure may be flexible to support different maxima) which is essential to construct a set of column 1 values (shown as column 5 in Table 1). The subsequent columns' values are generated by the previous column value and column 1's value. The value of $\{q_j\}$ may be selected from the set $\{1, 7, 11, 13, 17, 19, 23, 29, 31, 37, 41, 43, 47, 53, 59, 61, 67, 71, 73, 79, 83, 89\}$ sequentially on condition that g.c.d$\{q_j, p-1\}=1$. The $\Delta q_j$LUT 14 stores the difference sequence $\{q_j - q_{j-1}\}$, the values in column 3 of Table 2, instead of $\{q_j\}$ in order to reduce the storage area and calculate the value for the first column in a simple way. ADJLUT 12 adjusts the output value from $\Delta q_j$LUT 14 if there is any skipping of prime numbers in the $\{q_j\}$ sequence.

With regard to the recursive calculations performed in Table 2, $\{m_{ij}\}$ represent the $([i*q_j]\mod(p-1))$ element in the matrix. Column 0 is all 0s (i=0). Each column 1 modulo result can be obtained from its preceding row modulo value and the corresponding $\Delta q_j$. The subsequent columns' modulo results are calculated from the column 1 value and the respective preceding column's results as follows:

```
i=1:
   m_{1,j} = q_j mod(p-1) = (m_{1,j-1}+Δq_j)mod(p-1), where mod(p-1) is
   calculated as follows:
      if (m_{1,j-1}+Δq_j) >= (p-1) then
         m_{1,j}=(m_{1,j-1}+Δq_j)-(p-1);
      else
         m_{1,j}=(m_{1,j-1}+Δq_j);
   end if;
i>1:
   m_{i,j} =i*q_j mod(p-1) = (q_j+(i-1)*q_j)mod(p-1)
         = [q_j mod(p-1) + (i-1)*q_j mod(p-1)]mod(p-1)
         =(m_{1,j}+m_{i-1,j})mod(p-1), where mod(p-1) is calculated as follows:
      if (m_{1,j}+m_{i-1,j}) >= (p-1) then
         m_{i,j}=(m_{1,j}+m_{i-1,j})-(p-1);
      else
         m_{i,j}=(m_{1,j}+m_{i-1,j});
   end if;
```

TABLE 2

Values Input To and Calculated By Interleaver Address Generator 10

| J | $q_j$ | $\Delta q_j$ | 0 * $q_j$ mod (p − 1) | 1 * $q_j$ mod(p − 1) | i * $q_j$ mod(p − 1) |
|---|---|---|---|---|---|
| 0 | 1 | 1 | 0 | $m_{1,0} = q_0 \mod(p-1) = 1$ | $m_{i,j} = \begin{cases} m_{i-1,j} + m_{1,j} \\ m_{i-1,j} + m_{1,j} - (p-1), \text{if} > (p-1) \end{cases}$ |
| 1 | 7 | 6 | 0 | | |
| 2 | 11 | 4 + Δ | 0 | $m_{1,j} = \begin{cases} m_{1,j-1} + \Delta q_j \\ m_{1,j-1} + \Delta q_j - (p-1), \text{if} > (p-1) \end{cases}$ | $j = 0, \ldots R-1$ |
| 3 | 13 | 2 + Δ | 0 | | |
| 4 | 17 | 4 + Δ | 0 | $j = 1, \ldots, R-1$ | |
| . . . | . . . | . . . | . . . | | |
| R − 2 | 73 | 2 | 0 | | |
| R − 1 | 79 | 6 | 0 | | |

TABLE 2-continued

Values Input To and Calculated By Interleaver Address Generator 10

| J | $q_j$ | $\Delta q_j$ | $0 * q_j \bmod (p-1)$ | $1 * q_j \bmod (p-1)$ | $i * q_j \bmod (p-1)$ |
|---|---|---|---|---|---|
| R | 83 | 4 | 0 | | |
| R + 1 | 89 | 6 | 0 | | |

The first storage 18 is used to store the column 1 values and the second storage 20 is used to store the most recent column values. The second storage 20 is updated at every cycle with the new matrix value. ACSUB unit 40 is the add-compare-subtract to calculate the new matrix value. Two ACSUB units 40,42 and two ports for the first and second storage units are employed to handle the pruning of invalid addresses without introducing a clock cycle delay. Control logic 30 generates the address signal and write enable signals we_1 and we_p, etc for the ADJLUT 12, $\Delta q_j$LUT 14, and the first and second storages 18,20. The control logic 30 also generates enable and control signals to organize the operation of the ACSUB units 40,42. In the pruning cycle, both ACSUB units 40,42 are turned on to calculate two interleaver addresses simultaneously, otherwise both ACSUB units 40,42 are active alternatively to provide one effective value in every clock cycle. In this manner, ACSUB units 40,42 do not need to repeat any unnecessary calculations, so half of the power for the add, comparison and subtraction can be saved. T(j) LUT circuit 46 is the look up table for the row permutation of the matrix, which is used to generate the respective position of the interleaving after multiplication with the column number of the input data. S(i) LUT circuit 44 is the intra-row permutation sequence that may be downloaded for each code block from a DSP or another micro-controller, or in the alternative, hard-wired into ROM. Each of these options is further discussed below. The matrix value is the input to the S(i) LUT 44 as the index of the look up table and the outputs of the S(i) LUT 44 are part of the final interleaving. S(i) LUT 44 may be implemented with a double port RAM and double multipliers designed to produce two outputs per clock cycle. Both outputs go through the prune control circuit 60 to provide one interleaving address per clock cycle.

In order to perform the operations described above, the following input parameters are required to be downloaded: K(block length), prime_1 (Prime number minus one), Prune_Value (the number of value needed to be pruned), Col C(the number of columns), Row R (the number of rows) and an SI table. These input parameters may be provided from several sources.

Figure 2:
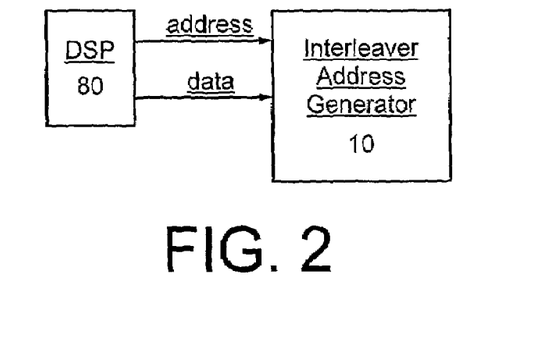
FIG. 2 illustrates the interleaver address generator 10 of FIG. 1 receiving auxiliary parameters from a digital signal processor (DSP).
Figure 3:
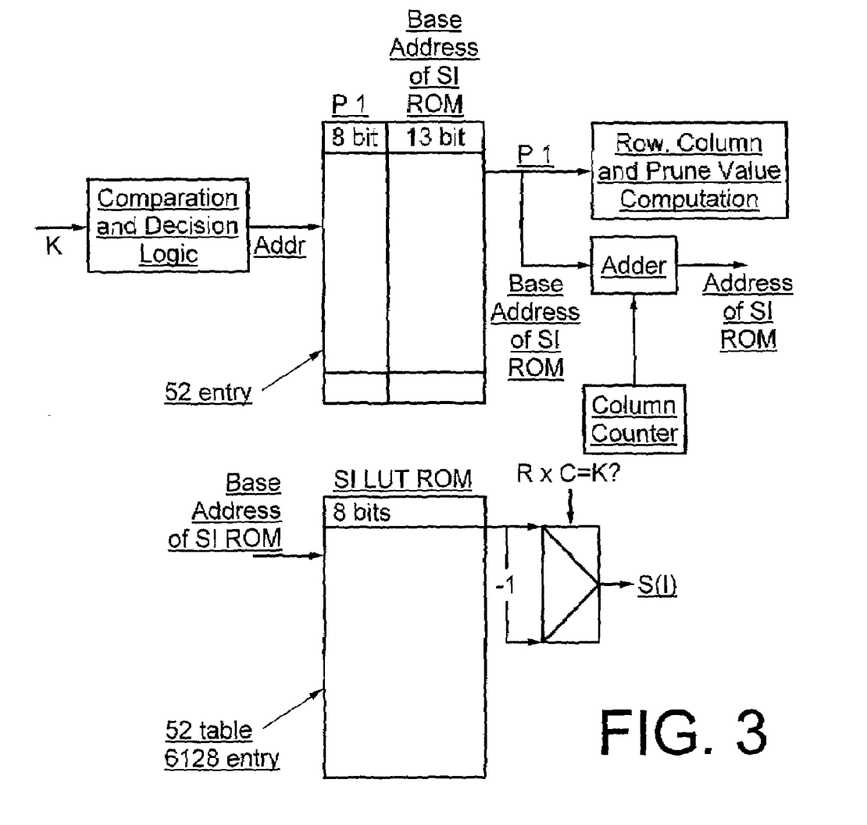
FIG. 3 illustrates the interleaver address generator 10 of FIG. 1 receiving auxiliary parameters from an all-hardware configuration.

A first source for the input parameters is a DSP 80, as illustrated in FIG. 2. A second source is an all-hardware solution. In this case, as illustrated in FIG. 3, all the possible prime numbers (P_1) and SI are stored in a ROM for block lengths from 40 to 5114. The Row R, Col C, and Prune_value can be calculated according to the P_1 looked up from the ROM table. The P_1 & SI base address ROM may be 1092 bits, and the SI ROM may be 6128*8 bits. Since s(0) is always 1, the SI ROM size can be further reduced to (6128−52)*8 bits. With the all-hardware generation for the auxiliary parameters, the SI LUT 44 employed in the interleaver address generator 10 can be omitted if there is already a SI ROM outside the interleaver address generator 10.

Figure 4:
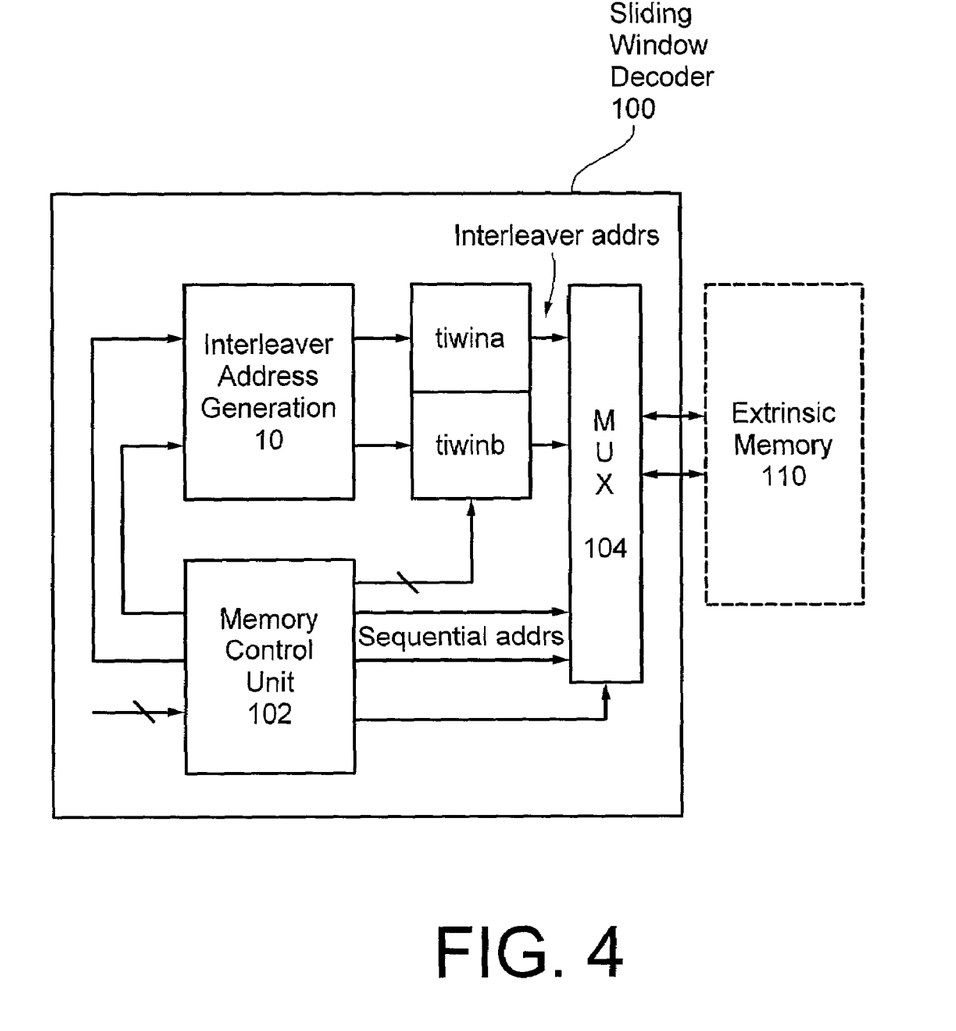
FIG. 4 illustrates the interleaver address generator of FIG. 1 equipped with additional logic for the decoder application.
Figure 5A:
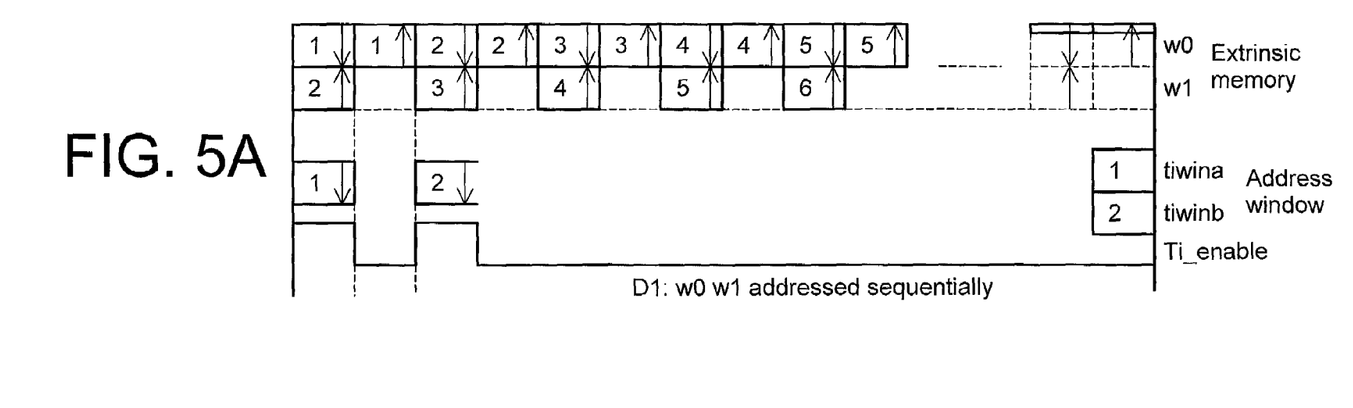
FIGS. 5A and 5B illustrate the operating of the interleaver address generator for the log MAP decoder application of FIG. 4 in sequential and pseudo-random modes, respectively.
Figure 5B:
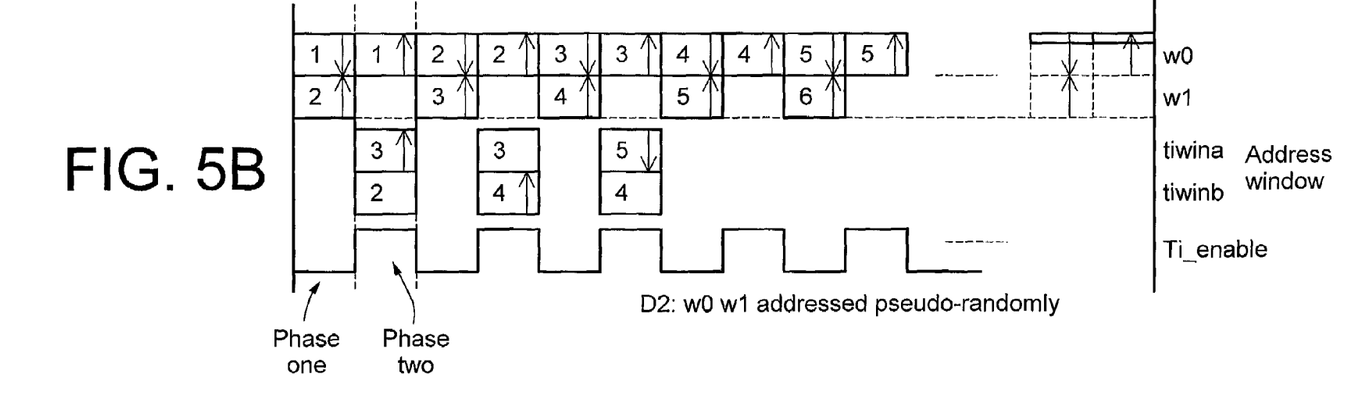

The interleaver address generator 10 may be used in a sliding window decoder 100 where the sliding window decoder 100 partitions the block into one or more windows. As illustrated in FIG. 4, the sliding window decoder 100 may also include a memory control unit 102 for controlling the generation of interleaved and sequential addresses and a MUX 104 for sending one or both to an extrinsic memory 110. With a two phase windowed logMAP decoder, the sliding window decoder 100 can simultaneously fetch two blocks from the extrinsic memory 110 in order to calculate a forward recursion on the window and a dummy backward recursion from the end of the next window to the end of the current window. In the second phase, the logMAP decoder calculates the backward recursion for the current window. An efficient method of generating turbo interleaver addresses for a new window period of the sliding window decoder 100 is to calculate them in the current window period phase two, and then store the addresses in a cache memory for use in the next window period. TIWINA and TIWINB, shown in FIG. 4, are "turbo interleaver windows memories A and B", and are used store windows of addresses. FIG. 5A and FIG. 5B show how the address windows can be updated and used in a particular two-phase logMAP algorithm for decoder 100. The decoder operates in sequential order and pseudo-random order alternately. FIG. 5A shows the decoder 100 operating in sequential access mode, and FIG. 5B shows the decoder 100 operating in pseudo-random access mode that uses the interleaved addresses. In phase one, windows w0 and w1 are accessed to calculate alphas and dummy betas, and in phase two the window w1 is accessed in a reverse order to calculate true betas. The window may then be slid forward to the end of the block, as showed in FIGS. 5A and 5B. When in sequential order, TIWINA and TIWINB are equipped with the first two windows' interleaver addresses in order to address windows w0 and w1 at the very start of the phase one calculation during decoder's pseudo-random access mode. In each current window period, the addresses for w1 remain and used for the next window period to address w0, and the memory storing the addresses for w0 are updated during phase two for next window period to address w1. As a result, TIWINA and TIWINB are accessed in forward order and reverse order alternately to provide the addresses for w0 and w1 due to the properties of the sliding window logMAP decoder, as illustrated in FIG. 5B.

As described above, the interleaver of the exemplary embodiments of the present invention reduces the number of MOD calculations necessary by utilizing old results efficiently. The interleaver of the exemplary embodiments of the present invention uses two storage areas 18, 20, one to store the first column of $m_{1,j}$ results and the other to store the latest column of $m_{i,j}$ results, where $m_{i,j}$ is the result of ACSUB units 40, 42. The results from the two ACSUB units 40,42 are stored into the j and j+1 row of the storage area 20, wheras $m_{1,j}$ is stored in the storage 18. j may vary from 0 to 20, increases by 1 every clock cycle. In the interleaver of the exemplary embodiments of the present invention, all a DSP is needed for is to provide the S(i) sequence. If the overall encoder/decoder architecture does not include a DSP, the all-hardware solution described above may be used to calculate the S(i), Col C, Row R, and Prune_value parameters.

It is further noted, that although the present invention has been described in the context of calculating two columns using two ACSUB units, embodiments using any other number of columns less than the total number of columns are also considered to be within the scope of the present application.

It is further noted than a DSP is capable of performing the MOD calculation, so another option, with the scope of the present invention is to implement the interleaver algorithm via DSP firmware and download the results into a memory for hardware to use and access.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Those skilled in the art will readily recognize that these and various other modifications, arrangements and methods can be made to the present invention without strictly following the exemplary applications illustrated and described herein and without departing from the spirit and scope of the present invention. It is therefore contemplated that the appended claims will cover any such modifications or embodiments as fall within the true scope of the invention.

What is claimed is:

1. An interleaver address generator, comprising:
    a matrix generator for generating a number of matrix rows and a number of matrix columns based on a plurality of prime numbers, an input number of columns C and an input number of rows R; and
    a circuit for calculating interleaved addresses on a column by column basis from intra-row and inter-row permutation values using fewer than C columns.

2. The interleaver address generator of claim 1, further comprising:
    a calculating unit for calculating inputs to a look up table and supplying the inputs to generate the inter-row permutation values;
    a circuit for generating the intra-row permutation values in the R×C matrix of the interleaver address generator; and
    a storage area for storing the values for the inter-row permutation in the R×C matrix.

3. The interleaver address generator of claim 2, wherein the calculating unit calculates values for a first column $C_1$ and a second column $C_2$ and values for subsequent columns $C_2$ to $C_n$ are calculated based on the values of $C_1$ and values for a preceding column $C_{n-1}$.

4. The interleaver address generator of claim 3, wherein the calculating unit calculates values for a subsequent column $C_n$ based on the values of the first column $C_1$ and values for the preceding column $C_{n-1}$.

5. The interleaver address generator of claim 2, wherein inputs to the lookup table are computed by modulo arithmetic.

6. The interleaver address generator of claim 5, wherein inputs to the lookup table are computed using only adding, comparing, and subtraction operations.

7. The interleaver address generator of claim 5, wherein inputs to the lookup table are computed using a single add, compare, and subtract operation.

8. The interleaver address generator of claim 1, wherein the circuit recursively calculates the interleaved addresses.

9. The interleaver address generator of claim 1, wherein the circuit calculating interleaved addresses on a column by column basis using two C columns.

10. The interleaver address generator of claim 1, wherein the matrix generator generates a sequence of difference values between the plurality of prime numbers based on an input parameter, which is a variant of a prime number.

11. The interleaver address generator of claim 10, wherein the matrix generator generates values of the first column $C_1$ based on a difference value between the plurality of prime numbers and value for a preceding row of the first column $C_1$.

12. The interleaver address generator of claim 11, wherein the pruning circuit employs double paths to generate a current and a subsequent interleaved address at the same time.

13. The interleaver address generator of claim 12, wherein the pruning circuit may switch off one of the double paths.

14. The interleaver address generator of claim 1, further comprising a pruning circuit for pruning values from the intra-row and inter-row permutations in the R×C matrix prior to obtaining the interleaved addresses.

15. The interleaver address generator of claim 1, wherein the interleaver address generator receives a plurality of parameters, the plurality of parameters include a prime number, a pruning value, the number of rows R, and the number of columns C.

16. The interleaver address generator of claim 15, wherein the plurality of parameters are supplied from a digital signal processor which calculates the parameters based on a block length K.

17. The interleaver address generator of claim 15, wherein the plurality of parameters are supplied from a hardware circuit which has an input parameter of the block length K.

18. The interleaver address generator of claim 1, wherein the matrix generator includes at least two sets of D flip-flops, one set for the first column $C_1$ and a second set for subsequent columns $C_n$.

19. A decoder including the interleaver address generator of claim 1, the decoder further comprising:
    a memory control unit for generating sequential addresses and controlling the interleaver address generator to output a block of segmented interleaved addresses;
    at least two memories for storing blocks of the interleaved addresses; and
    a multiplexer for outputting at least two blocks of the interleaved addresses or the sequential addresses to an extrinsic memory.

20. The decoder of claim 19, wherein the memory control unit controls the interleaved addresses to be filled into the two memories alternately with each memory to be addressed in forward order and reverse order alternately.

21. The decoder of claim 19, wherein the memory control unit controls the interleaver address generator to generate only two blocks of segmented interleaved addresses in the first iteration and a remainder of interleaved addresses in a second iteration.

22. A method of generating an interleaved address in an interleaver, comprising:
    generating a number of matrix rows and a number of matrix columns in the interleaver based on a plurality of prime numbers, an input number of columns C and an input number of rows R; and calculating interleaved addresses column by column from the intra-row and inter-row permutation values using fewer than C columns in the interleaver.

23. The method of claim 22, further comprising:

calculating inputs to a look up table in the interleaver and supplying the inputs to the lookup table to generate the inter-row permutation values;

generating the intra-row permutation values in a R×C matrix of the interleaver; and storing the values for the inter-row permutation in the R×C matrix.

24. The method of claim 23, wherein inputs to determine the values for the inter-row permutation in the R×C matrix of the interleaver are computed by modulo arithmetic.

25. The method of claim 22, wherein the interleaved addresses are recursively calculated in the interleaver.

26. The method of claim 22, wherein the interleaved addresses are calculated on a column by column basis using two C columns.

27. The method of claim 26, wherein the values for a first column $C_1$ and a second column $C_2$ are calculated and values for subsequent columns $C_2$ to $C_n$ are calculated based on the values of the first column $C_1$ and values for a preceding column $C_{n-1}$.

28. The method of claim 22, wherein inputs to determine the values for the inter-row permutation in the R×C matrix of the interleaver are computed using only adding, comparing, and subtraction operations.

29. The method of claim 22, wherein inputs to determine the values for the inter-row permutation in the R×C matrix of the interleaver are computed using a single add, compare, and subtract operation.

30. A method of decoding a decoder, including the interleaver having an interleaver address generator including the method of claim 22, comprising:

generating sequential addresses and controlling the interleaver address generator to output a block of segmented interleaved addresses;

storing blocks of the interleaved addresses; and outputting at least two blocks of the interleaved addresses or the sequential addresses to an extrinsic memory of the decoder.

* * * * *